(12) United States Patent
Kim

(10) Patent No.: US 7,584,877 B2
(45) Date of Patent: Sep. 8, 2009

(54) TAPE FEEDER

(75) Inventor: Young-Il Kim, Anyang-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 0 days.

(21) Appl. No.: 11/973,258

(22) Filed: Oct. 5, 2007

(65) Prior Publication Data

US 2008/0216309 A1    Sep. 11, 2008

(30) Foreign Application Priority Data

Mar. 7, 2007   (KR) ..................... 10-2007-0022394

(51) Int. Cl.
  *B65H 20/00* (2006.01)
  *B23P 19/00* (2006.01)
(52) U.S. Cl. .................. 226/139; 29/743; 29/829; 226/45; 226/188; 221/186
(58) Field of Classification Search ........... 29/739–743, 29/809, 832, 835–837; 226/8, 120, 139; 221/72, 87, 25, 186, 197, 1, 5; 414/411, 414/416, 425
See application file for complete search history.

(56) References Cited

U.S. PATENT DOCUMENTS

| | | | | |
|---|---|---|---|---|
| 5,299,902 A * | 4/1994 | Fujiwara et al. | ........ | 414/416.01 |
| 6,077,022 A * | 6/2000 | Gfeller et al. | .......... | 414/416.01 |
| 6,082,428 A * | 7/2000 | Ando et al. | ................. | 156/584 |
| 6,318,437 B1 * | 11/2001 | Yoo et al. | .................... | 156/584 |
| 6,402,452 B1 * | 6/2002 | Miller et al. | ................ | 414/412 |
| 6,546,619 B1 * | 4/2003 | Shichi et al. | .................. | 29/837 |
| 6,631,552 B2 * | 10/2003 | Yamaguchi | .................. | 29/739 |
| 6,652,706 B1 * | 11/2003 | MacNeil et al. | ............. | 156/344 |
| 6,778,878 B1 * | 8/2004 | Kou | .......................... | 700/221 |
| 6,782,606 B2 * | 8/2004 | Bergstrom | .................... | 29/740 |

* cited by examiner

*Primary Examiner*—Minh Trinh
(74) *Attorney, Agent, or Firm*—Drinker Biddle & Reath LLP

(57) ABSTRACT

A tape feeder including an electronic component accommodating part installed at one side of a tape feeder main body to accommodate electronic components which are not picked up by a suction nozzle of an electronic component conveyance robot installed at an electronic component mounting device, thereby preventing the electronic components from clogging a carrier tape moving path, and storing the electronic components in the electronic component accommodating part. Therefore, it is possible to increase efficiency of equipment without operational delay and stoppage of the equipment, readily extract and reuse the electronic components accommodated in the electronic component accommodating part, and keep an operational environment clean.

18 Claims, 5 Drawing Sheets

TAPE FEEDER

CROSS-REFERENCE TO RELATED APPLICATION

This application claims the benefit of Korean Patent Application No. 2007-0022394, filed Mar. 7, 2007, the disclosure of which is hereby incorporated herein by reference in its entirety.

BACKGROUND OF THE INVENTION

1. Field of the Invention

The present invention relates to a tape feeder and, more particularly, to a tape feeder including an electronic component accommodating part installed at one side of a tape feeder main body to accommodate electronic components which are not picked up by a suction nozzle of an electronic component conveyance robot installed at an electronic component mounting device.

2. Description of the Related Art

Generally, an electronic component mounting device, referred to as a chip mounter, is an automated device used to mount electronic components such as semiconductor chips at a predetermined position on a printed circuit board. The various kinds of electronic components used in the electronic component mounting device can be supplied in various ways, and may be surface-mounted on the printed circuit board using a suction nozzle operated by a robot.

Electronic components can be supplied in various ways depending on an operational environment and characteristics of the electronic components. For example, when the electronic components are relatively large, the electronic components can be loaded on a tray and mounted on the printed circuit board. However, when the electronic components are small, it may be difficult to load the electronic components on the tray and mount the same on the printed circuit board.

In particular, when very small electronic components are mounted, since the electronic components may be frequently lost or damaged during operation, a specifically designed tape feeder may be used. A tape reel, on which a carrier tape is wound, is mounted on the tape feeder. Certain sizes of electric components are accommodated in the carrier tape at predetermined intervals. The tape feeder releases the carrier tape from the tape reel at predetermined intervals, and simultaneously removes a cover tape covering the electronic components attached to the carrier tape. The suction nozzle of the conveyance robot sucks the electronic components, with the cover tape being removed, to remove the electronic components from the carrier tape, and conveys the electronic components to a predetermined position on the printed circuit board.

Referring to FIGS. 1 and 2, illustrated is a conventional carrier tape 1 that includes a base tape 2, and a plurality of accommodating spaces 3 sequentially formed on the base tape 2 in a longitudinal direction thereof. The accommodating spaces 3 are maintained in a sealed state by the cover tape 5 until a semiconductor chip 4 is supplied to an electronic component mounting device. A plurality of conveyance holes 6 are formed along both sides of the base tape 2 in a longitudinal direction thereof.

In the conventional feeder 10, certain sizes of semiconductor chips 4 are accommodated on the carrier tape 1, and the tape reel, on which the carrier tape 1 is wound, is mounted on one side of the tape feeder main body 11. A sprocket 13 is rotatably installed at another side of the tape feeder main body 11 by an air cylinder (not shown). Teeth 14 meshed with the conveyance holes 6 are formed at an outer periphery of the sprocket 13. The teeth 14 are inserted into the conveyance holes 6 to convey the carrier tape 1 at predetermined pitches. The tape feeder 10 rotates the tape reel 12 to release the carrier tape 1 wound on the tape reel 12, and at the same time, removes the cover tape 5 covering the semiconductor chip 4 attached to the carrier tape 1. The cover tape 5 which is removed is collected into a cover tape collection part 15, and the teeth 14 of the sprocket 13 are sequentially inserted into the conveyance holes of the carrier tape 1.

The suction nozzle of the conveyance robot installed at the chip mounter (not shown) sucks the semiconductor chip 4, from which the cover tape 5 is removed, to remove the semiconductor chip 4 from the carrier tape 1, and conveys it to a predetermined position on the printed circuit board (not shown).

In the conventional tape feeder, when the suction nozzle of the chip mounter fails to pick up the semiconductor chip of the carrier tape (that is, a pick-up miss occurs), the semiconductor chip should be conveyed with a waste tape and discharged to the exterior of the feeder at a certain time.

However, when it is not possible for the semiconductor chip to be discharged to the exterior of the tape feeder, thereby clogging progress of the carrier tape, the semiconductor chips may be stacked on a feeder base and a feeder attach/detach rail, on which the tape feeder is mounted, thus creating operational difficulties and causing misalignment of a pick-up position of the semiconductor chip, thereby contaminating an operational environment.

As a result, the semiconductor chip cannot be smoothly supplied, and further, the operational process may be delayed or stopped.

SUMMARY OF THE INVENTION

In order to solve the foregoing and/or other problems, it is an aspect of the present invention to provide a tape feeder including an electronic component accommodating part installed at one side of a tape feeder main body to accommodate electronic components which are not picked up by a suction nozzle of an electronic component conveyance robot installed at an electronic component mounting device, to thereby smoothly perform a supply of the electronic components and keep an operational environment clean, and thus prevent the electronic components from clogging a carrier tape moving path.

Additional aspects and advantages of the present invention will be set forth as exemplary examples thereof in the description which follows and, in part, will be obvious from the description, or may be learned by practice of the invention.

According to an exemplary embodiment of the present invention, a tape feeder includes: a tape reel rotatably installed at one side of a tape feeder main body and on which a carrier tape is wound; a sprocket rotatably installed at another side of the tape feeder main body and including teeth meshed with conveyance holes of the carrier tape; a collection part for collecting the cover tape removed from the carrier tape; and an electronic component accommodating part installed at another side of a tape feeder main body to accommodate electronic components which are not picked up by a suction nozzle of an electronic component conveyance robot installed at an electronic component mounting device.

The electronic component accommodating part may be installed at a position on the carrier tape moving path, on which the electronic components are dropped.

The electronic component accommodating part may include a cover for covering the electronic component accommodating part.

One end of the cover may have a hinge part installed to pivot the cover, and another end of the cover may have a locking projection.

The cover may include a handle, and the hinge part may include a torsion spring inserted thereon to resiliently support the cover.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE INVENTION

Reference will now be made in detail to exemplary embodiments of the present invention, examples of which are illustrated in the accompanying drawings. The embodiments are described below in order to explain the present invention by referring to the figures.

Figure 1:
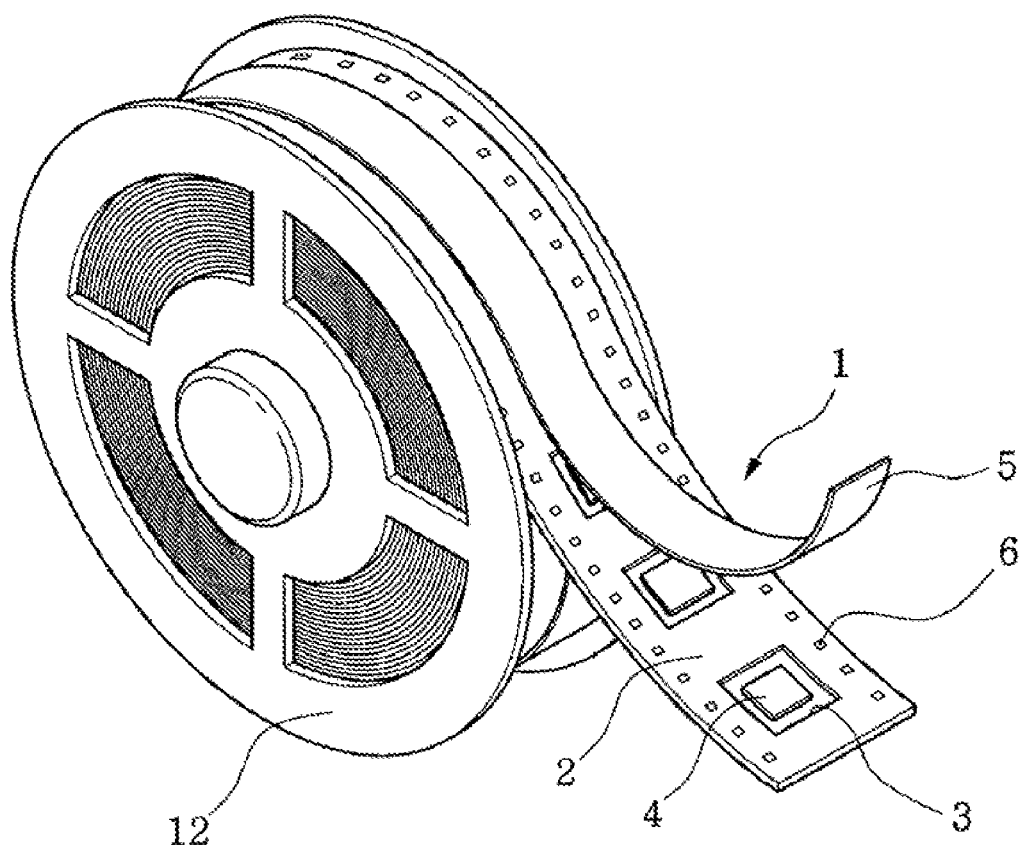
FIG. 1 is a perspective view of a conventional carrier tape.
Figure 2:
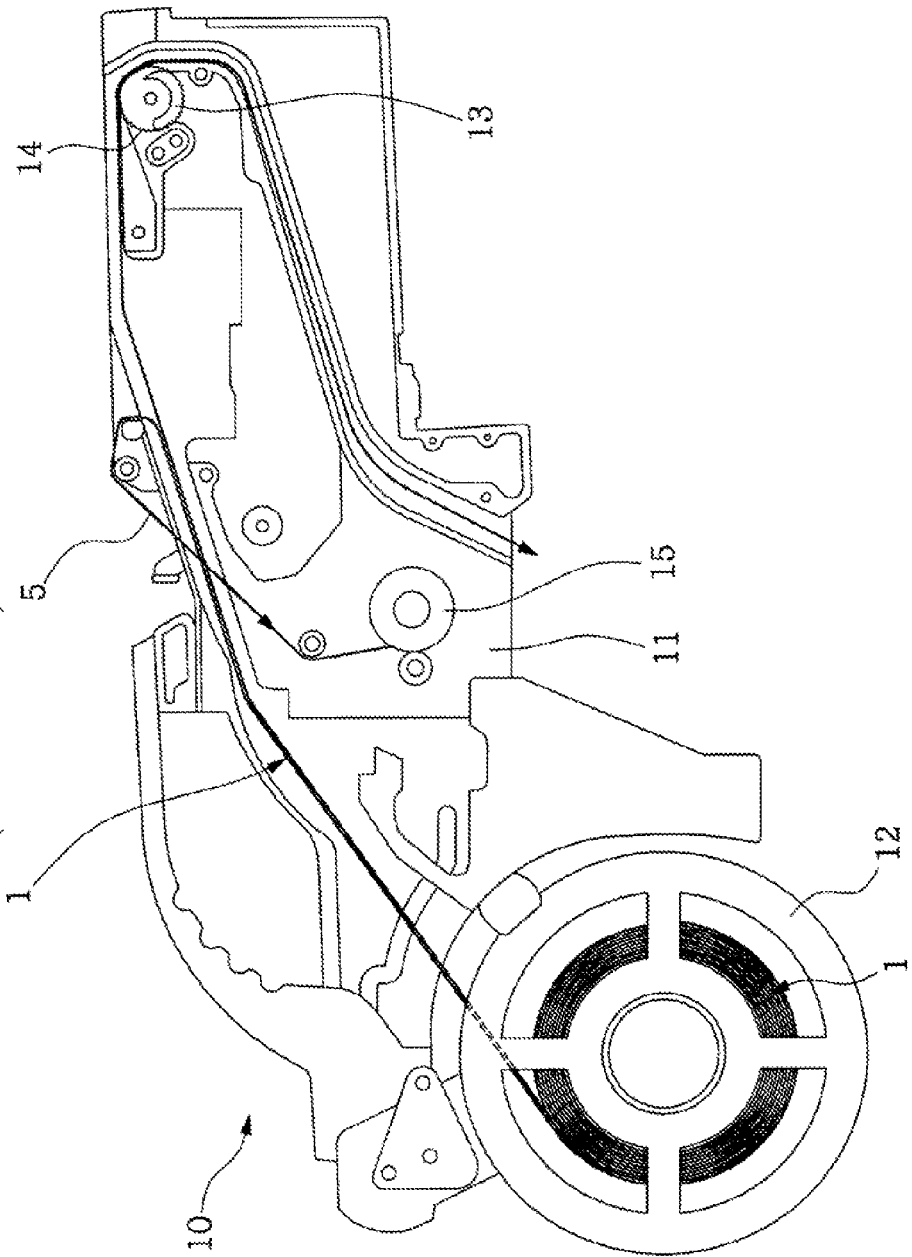
FIG. 2 is a plan view of a conventional tape feeder.
Figure 3:
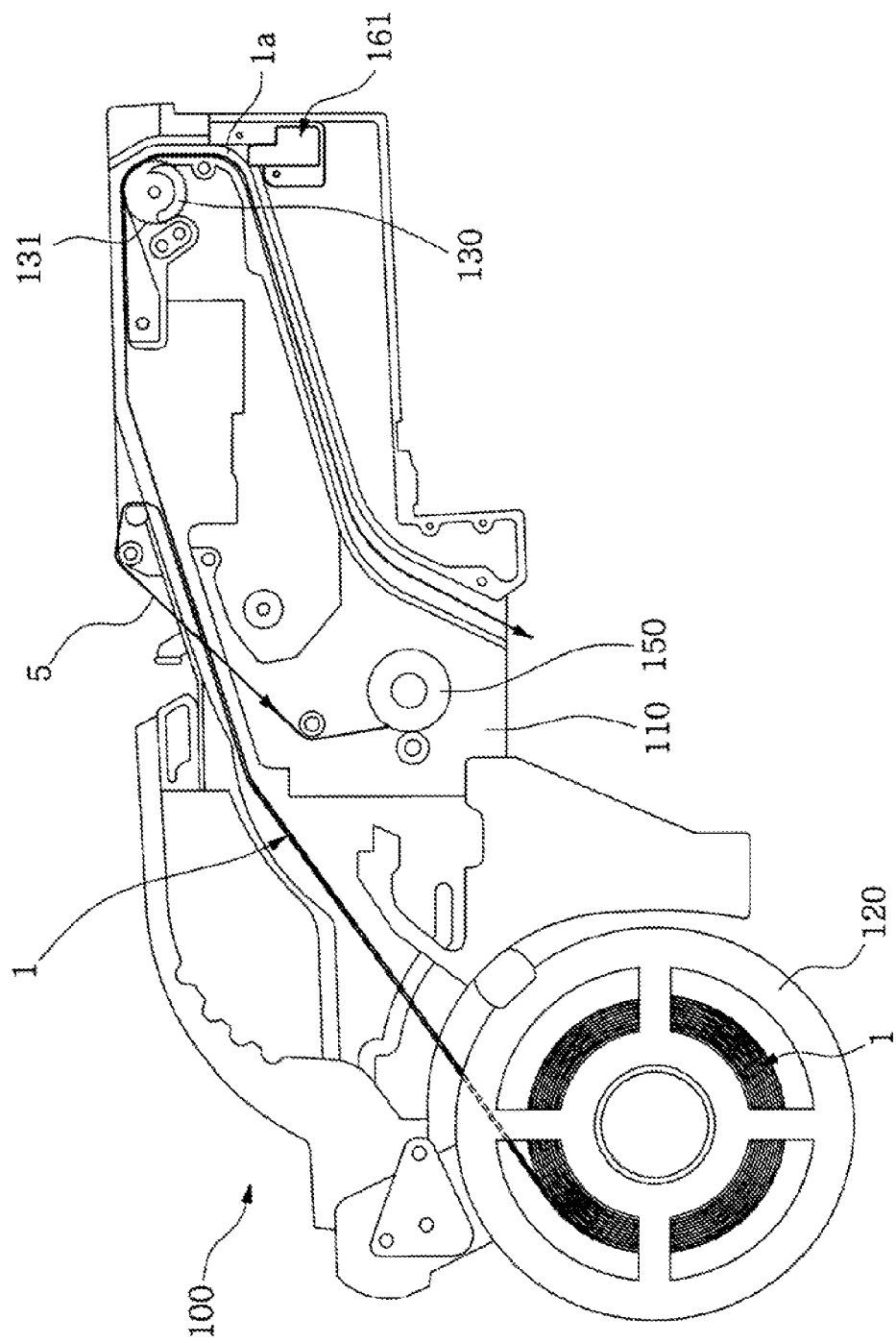
FIG. 3 is a plan view of a tape feeder in accordance with an exemplary embodiment of the present invention.
Figure 4:
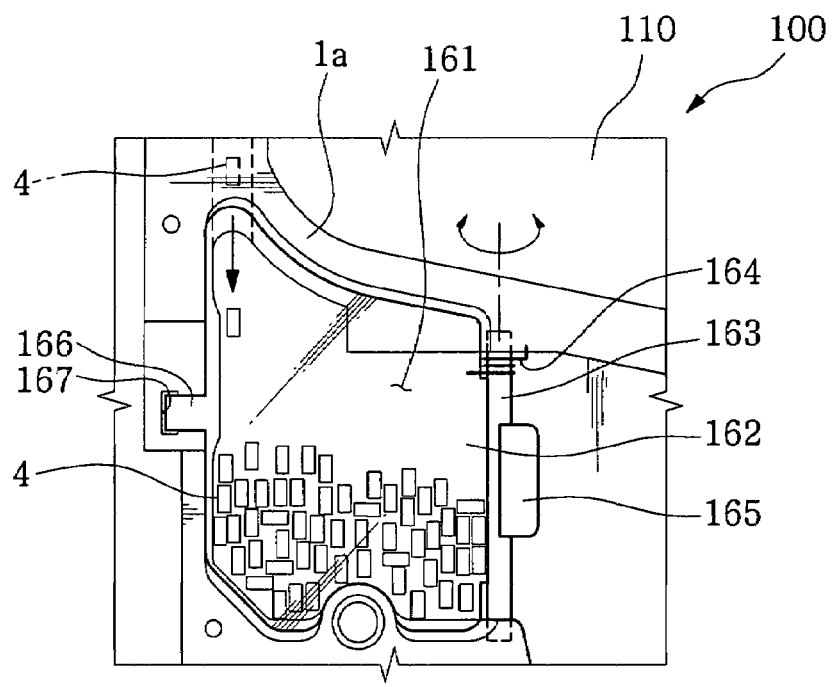
FIG. 4 is an enlarged view of FIG. 3.
Figure 5:
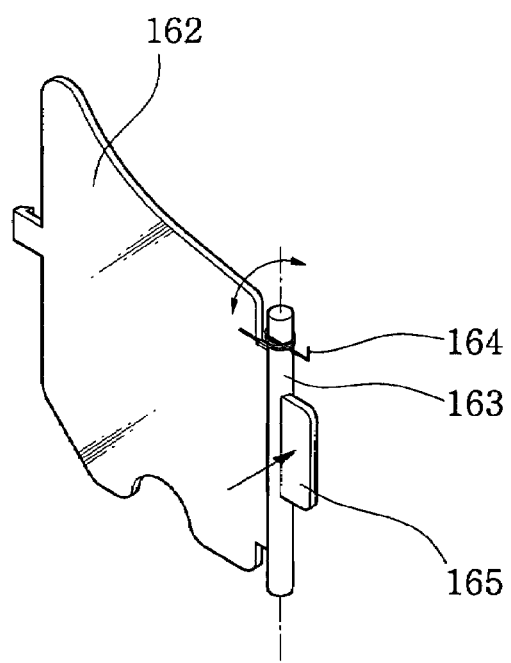
FIG. 5 is a perspective view of the cover assembly of the electronic component accommodating part tape feeder in accordance with an exemplary embodiment of the present invention.

As shown in FIGS. 3 to 5, the tape feeder 100 in accordance with an exemplary embodiment of the present invention includes a tape reel 120 rotatably installed at one side of a tape feeder main body 110 and on which a carrier tape 1 is wound. A sprocket 130 is rotatably installed at another side of the tape feeder main body 110. Teeth 131 meshed with conveyance holes 6 of the carrier tape 1 are formed at an outer periphery of the sprocket 130. A collection part 150 is installed at another side of the tape feeder main body 110 to collect the cover tape 5 removed from the carrier tape 1.

An electronic component accommodating part 161, referred to as a dump box, is installed at another side of the tape feeder main body 110 to accommodate electronic components which are not picked up by a suction nozzle of an electronic component conveyance robot installed at an electronic component mounting device (not shown). The electronic component accommodating part 161 should be installed at a position on a running path 1a of the carrier tape 1, on which the electronic component 4 is carried. The electronic component 4 not picked up by the suction nozzle of the electronic component conveyance robot is subsequently dropped into the electronic component accommodating part 161. That is, the electronic component accommodating part 161 is installed at one side of the tape feeder main body 110 and electronic components 4 not picked up by the suction nozzle of the electronic component conveyance robot are subsequently dropped into the electronic component accommodating part 161.

More specifically, the electronic component accommodating part 161 is installed at the position of the running path 1a of the carrier tape 1 on which the electronic components 4 are dropped. While the electronic component accommodating part 161 may be separately manufactured from the tape feeder main body 110, it yields a manufacturing cost advantage in that the electronic component accommodating part 161 is manufactured with the tape feeder main body 110.

A cover 162 for covering the electronic component accommodating part 161 is pivotally installed at one side of the tape feeder main body 110 by a hinge part 163. A torsion spring 164 may be inserted on the hinge part 163 to resiliently support the cover 162. The cover 162 may include a handle 165. In addition, a locking projection 166 may be formed at an end part of the cover 162, and a locking groove 167 may be formed at a corresponding position of the tape feeder main body 110.

Hereinafter, operation and effect of the tape feeder in accordance with the present invention will be described.

The tape feeder 100 rotates the tape reel 120 to release the carrier tape 1 wound on the tape reel 120 at predetermined intervals, and at the same time, removes the cover tape 5 covering the electronic components 4 accommodated on the carrier tape 1. The removed cover tape 5 is collected into a cover tape collection part 150, and teeth 131 of the sprocket 130 are sequentially inserted into the conveyance holes 6 of the carrier tape 1.

The suction nozzle of the conveyance robot installed at the electronic component mounting part (not shown) sucks the electronic component 4, with the cover tape 5 being removed, to remove the electronic component 4 from the carrier tape 1, and conveys it to a predetermined position on the printed circuit board (not shown).

In the series of processes, when an electronic component 4 is not picked up by the suction nozzle of the electronic component conveyance robot, the electronic component 4 is dropped into the electronic component accommodating part 161 and accommodated therein.

Electronic components 4 dropped into the electronic component accommodating part 161 are stacked to a certain height. As described above, the electronic components 4 which are not picked up by the suction nozzle of the electronic component conveyance robot, are stored in the electronic component accommodating part 161 to prevent clogging of the running path 1a of the carrier tape 1.

To empty the electronic component accommodating part 161, the handle 165 is pushed to pivot the hinge part 163 counterclockwise to open the cover 162. In this position, the electronic components 4 can be removed from the electronic component accommodating part 161. Since the torsion spring 164 is inserted on the hinge part 163, when the handle 165 is released, the cover 162 is closed again by the resilient force of the torsion spring 164.

The locking projection 166 and the locking groove 167 function to prevent the cover 162 from being accidentally opened due to operator error.

Figure 6:
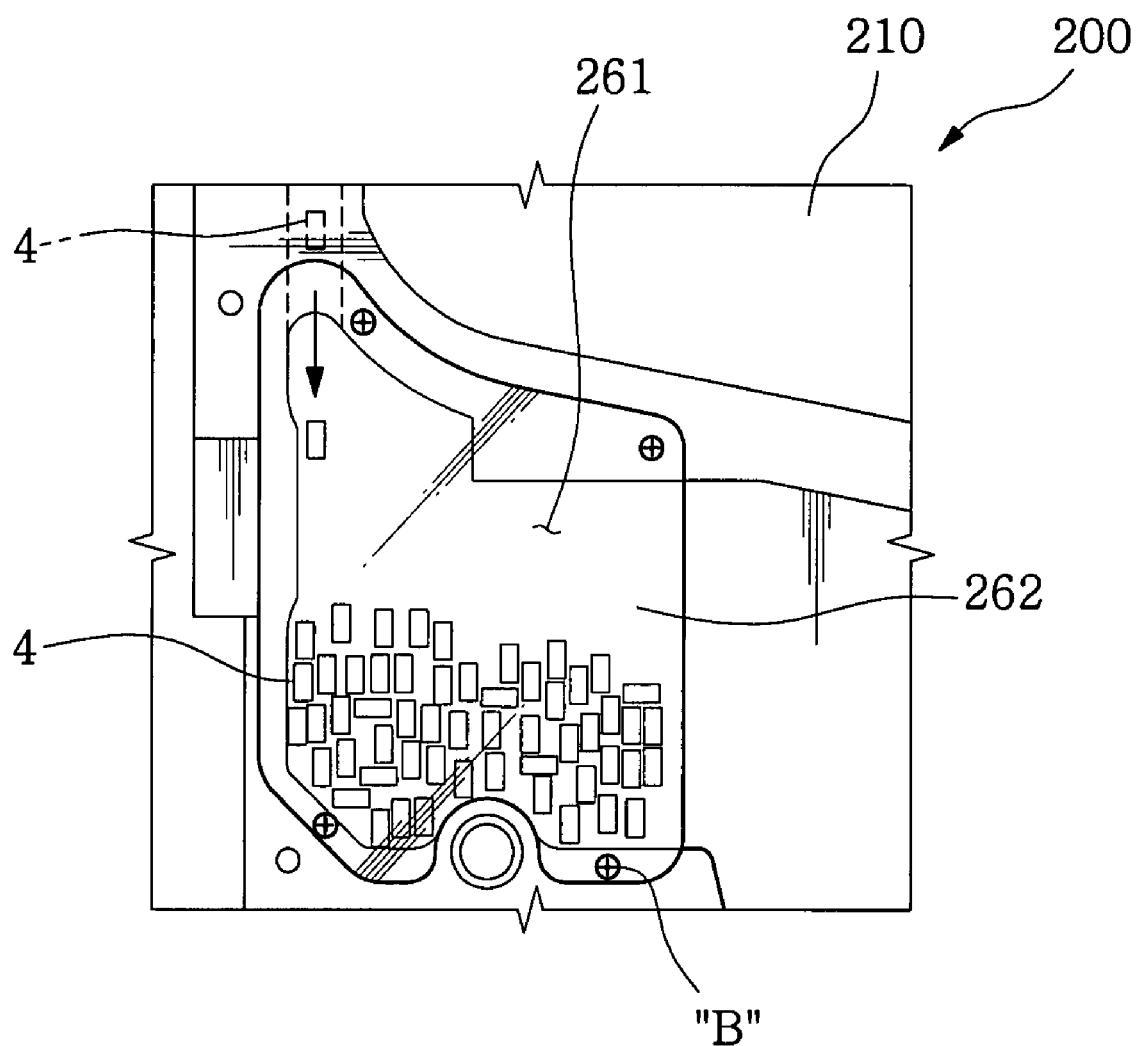
FIG. 6 is a front view of a cover of a tape feeder in accordance with another exemplary embodiment of the present invention.

As shown in FIG. 6, the tape feeder in accordance with another exemplary embodiment of the present invention includes an electronic component accommodating part 261 formed at one side of a tape feeder main body 210, and a cover 262 covering the electronic component accommodating part 261. The cover 262 may be fixed by bolts B. Electronic components 4 are dropped into and accommodated in the electronic component accommodating part 261. In order to remove the electronic components 4 stacked in the electronic component accommodating part 261, an operator can simply release the bolts B and open the cover 262.

As can be seen from the foregoing, electronic components which are not picked up by a suction nozzle of an electronic component conveyance robot are prevented from clogging the running path of a carrier tape, and are stored in an electronic component accommodating part, thereby increasing efficiency and avoiding operational delay or stoppage of equipment.

In addition, the electronic components accommodated in the electronic component accommodating part can be readily extracted and reused.

Further, since the electronic components which are not picked up by the suction nozzle of an electronic component conveyance robot are stored in the electronic component accommodating part, it is possible to keep an operational environment clean.

Although a few embodiments of the present invention have been shown and described, it will be appreciated by those skilled in the art that changes may be made to these embodiments without departing from the principles and spirit of the invention, the scope of which is defined in the appended claims and their equivalents.

What is claimed is:

1. A tape feeder comprising:
    a carrier tape comprising electronic components, wherein the electronic components remaining on the carrier tape beyond a pick-up point are remaining components;
    a separating mechanism for separating the remaining components from the carrier tape; and
    an electronic component accommodating part installed at one side of a tape feeder main body to accommodate solely the remaining separated components;
    wherein the separating mechanism comprises a break in a channel that channels the carrier tape, the electronic component accommodating part having an opening that faces the break in the channel.

2. The tape feeder according to claim 1, wherein the electronic component accommodating part is installed at a position on a carrier tape moving path, on which the electronic components are dropped.

3. The tape feeder according to claim 1, wherein the electronic component accommodating part comprises a cover for covering the electronic component accommodating part.

4. The tape feeder according to claim 3, wherein one end of the cover is provided with a hinge part installed to pivot the cover.

5. The tape feeder according to claim 3, wherein the cover has a handle.

6. The tape feeder according to claim 5, wherein a torsion spring is disposed on the hinge part to resiliently urge the cover to a closed position.

7. The tape feeder according to claim 6, wherein the cover has a locking projection installed at its one side.

8. The tape feeder according to claim 3, wherein the cover is fixed to the tape feeder main body by bolts.

9. The tape feeder according to claim 1, wherein the separating mechanism further comprises a curved guide that contacts the carrier tape, the curved guide having a radius small enough relative to the electronic component size to separate the electronic component from the carrier tape.

10. A tape feeder comprising:
    a tape reel rotatably installed at one side of a tape feeder main body and on which a carrier tape is wound, the carrier tape comprising electronic components and a cover tape, wherein the electronic components remaining on the carrier tape beyond a pick-up point are remaining components;
    a sprocket rotatably installed at another side of the tape feeder main body and having teeth meshed with conveyance holes of the carrier tape;
    a collection part for collecting the cover tape removed from the carrier tape;
    a separating mechanism for separating the remaining components from the carrier tape located beyond the pick-up point; and
    an electronic component accommodating part installed at another side of a tape feeder main body to accommodate solely the remaining separated components;
    wherein the separating mechanism comprises a break in a channel that channels the carrier tape, the electronic component accommodating part having an opening that faces the break in the channel.

11. The tape feeder according to claim 10, wherein the electronic component accommodating part comprises a cover for covering the electronic component accommodating part.

12. The tape feeder according to claim 11, wherein one end of the cover is provided with a hinge part installed to pivot the cover.

13. The tape feeder according to claim 11, wherein the cover has a handle.

14. The tape feeder according to claim 13, wherein a torsion spring is disposed on the hinge part to resiliently urge the cover to a closed position.

15. The tape feeder according to claim 14, wherein the cover has a locking projection installed at its one side.

16. The tape feeder according to claim 11, wherein the cover is fixed to the tape feeder main body by bolts.

17. The tape feeder according to claim 10, wherein the electronic component accommodating part is installed at a position on the carrier tape moving path, on which the electronic components are dropped.

18. The tape feeder according to claim 10, wherein the separating mechanism further comprises a curved guide that contacts the carrier tape, the curved guide having a radius small enough relative to the electronic component size to separate the electronic component from the carrier tape.

* * * * *